(12) United States Patent
Kim

(10) Patent No.: US 8,189,390 B2
(45) Date of Patent: May 29, 2012

(54) NAND FLASH ARCHITECTURE WITH MULTI-LEVEL ROW DECODING

(75) Inventor: Jin-Ki Kim, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 239 days.

(21) Appl. No.: 12/495,089

(22) Filed: Jun. 30, 2009

(65) Prior Publication Data

US 2010/0226179 A1   Sep. 9, 2010

Related U.S. Application Data

(60) Provisional application No. 61/157,594, filed on Mar. 5, 2009.

(51) Int. Cl.
*G11C 16/04* (2006.01)

(52) U.S. Cl. ......... 365/185.11; 365/185.12; 365/185.13; 365/185.17; 365/230.03; 365/230.06

(58) Field of Classification Search .............. 365/185.11, 365/185.12, 185.13, 185.17, 230.03, 230.06
See application file for complete search history.

(56) References Cited

U.S. PATENT DOCUMENTS

| | | | |
|---|---|---|---|
| 5,473,563 A | 12/1995 | Suh et al. | |
| 5,621,690 A * | 4/1997 | Jungroth et al. | 365/200 |
| 5,896,340 A | 4/1999 | Wong et al. | |
| 6,643,184 B2 * | 11/2003 | Pio | 365/185.29 |
| 7,035,162 B2 * | 4/2006 | Chung et al. | 365/230.03 |
| 7,079,417 B2 | 7/2006 | Nam et al. | |
| 7,406,649 B2 * | 7/2008 | Shimizume et al. | 714/773 |
| 7,423,910 B2 | 9/2008 | Umezawa | |
| 7,532,510 B2 * | 5/2009 | Lee et al. | 365/185.11 |
| 7,577,032 B2 * | 8/2009 | Umezawa | 365/185.13 |
| 7,821,833 B2 | 10/2010 | Tanuma et al. | |
| 7,940,578 B2 | 5/2011 | Kang et al. | |
| 2002/0186590 A1 * | 12/2002 | Lee | 365/185.17 |
| 2004/0047224 A1 | 3/2004 | Ha | |
| 2004/0246806 A1 | 12/2004 | Ha | |
| 2005/0226086 A1 | 10/2005 | Sugawara | |

FOREIGN PATENT DOCUMENTS

| | | |
|---|---|---|
| EP | 1028433 A1 | 8/2000 |
| EP | 1047077 A1 | 10/2000 |

OTHER PUBLICATIONS

International Search Report from International Application No. PCT/CA2010/000260 dated Apr. 26, 2010.
M. Momodomi, et al.; "A 4-Mb NAND EEPROM with Tight Programmed $V_1$ Distribution"; IEEE Journal of Solid-State Circuits, vol. 26, No. 4, pp. 492-496, Apr. 1991.

(Continued)

*Primary Examiner* — VanThu Nguyen

(57) ABSTRACT

A NAND flash memory device includes a NAND flash memory array defined as a plurality of sectors. Row decoding is performed in two levels. The first level is performed that is applicable to all of the sectors. This can be used to select a block, for example. The second level is performed for a particular sector, to select a page within a block in the particular sector, for example. Read and program operations take place to the resolution of a page within a sector, while erase operation takes place to the resolution of a block within a sector.

24 Claims, 14 Drawing Sheets

OTHER PUBLICATIONS

Jin-Ki Kim, et al.; "A 120-mm$^2$ 64-Mb NAND Flash Memory Achieving 180 ns/Byte Effective Program Speed"; IEEE Journal of Solid-State Circuits, vol. 32, No. 5, pp. 670-680, May 1997.

Kang-Deog Suh, et al.; "A 3.3 V 32 Mb NAND Flash Memory with Incremental Step Pulse Programming Scheme"; IEEE Journal of Solid-State Circuits, vol. 30, No. 11, pp. 1149-1156, Nov. 1995.

Kenichi Imamiya, et al.; "A 125-mm$^2$ 1-Gb NAND Flash Memory with 10-Mbyte/s Program Speed"; IEEE Journal of Solid-State Circuits, vol. 37, No. 11, pp. 1493-1500, Nov. 2002.

R. Kirisawa, et al.; "A NAND Structured Cell with a New Programming Technology for Highly Reliable 5V-Only Flash EEPROM"; Symposium on VLSI Technology, Dig. Tech. Papers, pp. 129-130, Jun. 1990.

S. Aritome, et al.; "A Reliable Bi-Polarity Write/Erase Technology in Flash EEPROMs"; IEDA4 Tech. Dig., pp. 111-1 Dec. 14, 1990.

R. Shirota, et al.; "A 2.3 µm$^2$ Memory Cell Structure for 16Mb NAND EEPROMs"; IEDM Tech. Dig., pp. 103-105, Dec. 1990.

Ken Takeuchi, et al.; "A 56nm CMOS 99mm2 8Gb Multi-level NAND Flash Memory with 10MB/s Program Throughput"; International Solid-State Circuits Conference; Dig. Tech. Paper, pp. 144-145, Feb. 2006.

Eran Gal, Sivan Toledo, "Algorithms and Data Structures for Flash Memories"; ACM Computing Surveys, vol. 37, No. 2, pp. 138-163, Jun. 2005.

Samsung's 16Gb Multi-level Cell NAND Flash Specification: K9GAG08U0M.pdf, Apr. 2006.

* cited by examiner

NAND FLASH ARCHITECTURE WITH MULTI-LEVEL ROW DECODING

CROSS REFERENCE TO RELATED APPLICATION

This application claims the benefit of U.S. Provisional Application No. 61/157,594, filed Mar. 5, 2009, the content which is incorporated herein by reference in its entirety.

FIELD

A NAND flash memory device is disclosed.

BACKGROUND

In conventional NAND flash memory, erasing is performed on a per-block basis. In contrast, read and program operation takes place on a per-page basis.

BRIEF DESCRIPTION OF THE DRAWINGS

Example embodiments will now be described with reference to the attached drawings in which.

DETAILED DESCRIPTION

Figure 1:
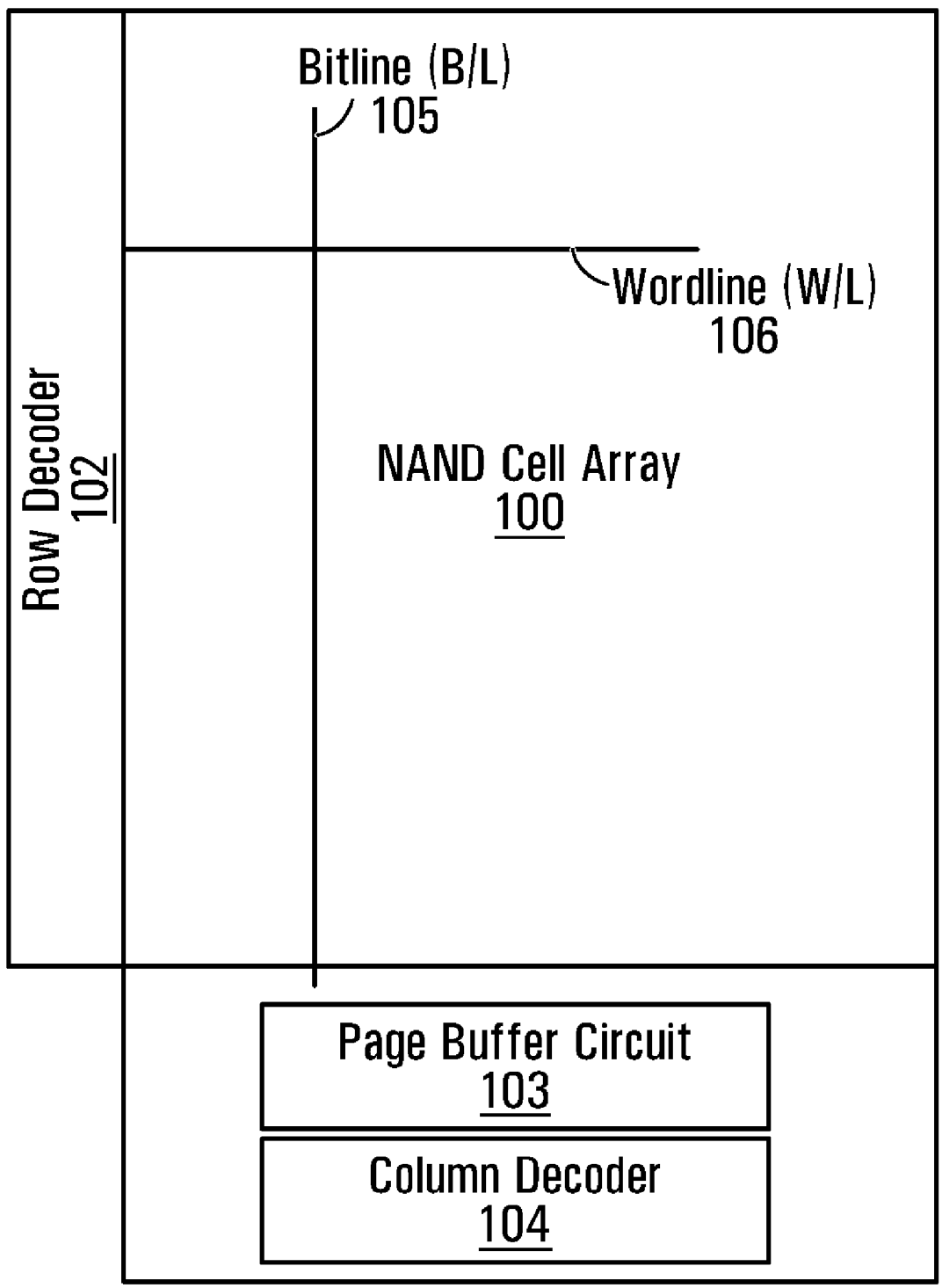
FIG. 1 is a block diagram of a typical memory core architecture in NAND flash memory.

FIG. 1 illustrates a memory core architecture in a NAND flash memory. The NAND flash memory core comprises a NAND memory cell array 100, a row decoder 102 and a page buffer circuit 103 and column decoder 104. The row decoder 102 is connected to the NAND memory cell array 100 by a set of wordlines, only one wordline 106 being shown in FIG. 1 for simplicity. The page buffer circuit 103 is connected to the NAND memory cell array 100 through a set of bitlines, only one bitline 108 being shown in FIG. 1 for simplicity.

The cell array structure of the NAND flash memory comprises a set of n erasable blocks. Each block is subdivided into m programmable pages (rows).

Erasing for the memory core architecture of FIG. 1 is performed on a per-block basis. In contrast, read and program operation takes place on a per-page basis.

A NAND flash memory having the core architecture of FIG. 1 flash suffers from at least three limitations. First, bits can only be programmed only after erasing a target memory array. Second, each cell can only sustain a limited number of erasures, after which it can no longer reliably store data. In other words, there is a limitation in the number of erase and program cycle to cells (i.e. endurance, typically 10,000~100,000 cycles). Third, the minimum erasable array size is much bigger than the minimum programmable array size. Due to these limitations, sophisticated data structures and algorithms are implemented to effectively use flash memories.

When the flash controller requests data write or data modification into even only a small portion of the page, typically the block containing a page to be modified will be reprogrammed to one of free (empty) blocks declared by an erase-unit reclamation process. In this case, valid pages containing original data in the original block are copied to the selected free block. After that, the new block having modified data in a page with original data in the rest of pages is remapped to the valid block address by a virtual mapping system in the flash controller. The original block is now obsolete and will be declared as a free block by the erase-unit reclamation process after it has been erased.

The limited number of erase-program cycles (endurance) limits the lifetime of a flash device. It would be advantageous to have a lifetime that is as long as possible, and this depends on the pattern of access to the flash device. Repeated and frequent rewrites to a single cell or to a small number of cells will bring the onset of failures soon and so end the useful lifetime of the device quickly.

Moreover, in a flash memory system having multiple flash devices, if there is significantly uneven use among devices in the flash memory system, one device will reach an end of lifetime at a time when other devices have significant life left in them. When the one device reaches an end of life time, the entire memory system may have to be replaced, and this greatly reduces the life time of the flash memory system.

If rewrites can be evenly distributed to all cells of the device, the onset of failures will be delayed as much as possible, maximizing the lifetime of the device. To extend the device lifetime by even use across all the cells of the device, many wear-levelling techniques and algorithms have been proposed and implemented in flash memory systems.

The cell arrays of NAND flash have been so miniaturized over the course of time that they have reached the point where any further reduction in process technology is expected to drastically reduce the maximum number of erase-program cycles.

According to one broad aspect, provided is a NAND flash memory core with multi-level row decoding.

According to another broad aspect, provided is a NAND flash memory device comprising: peripheral circuitry, input/output pads, and a high voltage generator; a NAND flash memory core comprising: a NAND memory cell array comprising a plurality of rows by a plurality of columns, the cells arranged into a plurality of sectors, each sector comprising the cells of a plurality of said columns; the cells arranged into a plurality of blocks, each block comprising cells of a plurality of said rows; the NAND memory cell array configured for erasure to a resolution of one block within one sector, and configured for read and program to a resolution of one row within one sector.

According to another broad aspect of, provided is a method in a NAND flash memory core comprising: performing multi-level row decoding. Due to the size mismatch between read/program and erase, the block copy operations described above introduce unnecessary program operations because unaffected data in pages of the block are reprogrammed (copied) to the new block along with the modified data. There could be a dramatic extension to the device lifetime if the minimum erasable array size is smaller than an entire block.

Figure 2:
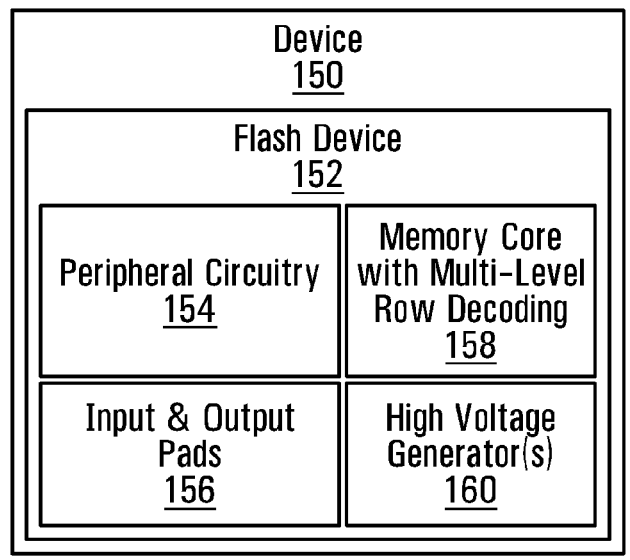
FIG. 2 is a block diagram of an example NAND flash device within which one of the NAND core architectures described herein might be implemented.

FIG. 2 is a block diagram of a device 150 containing a NAND flash memory device 152. The NAND flash memory device 152 has a memory core with multi-level row decoding, generally indicated at 158. In addition, the NAND flash memory device 152 has a peripheral circuitry 154, input and output pads 156, and high voltage generator(s) 160. The peripheral circuitry 154 may, for example, comprise one or more of input and output buffers for address and data, input buffers for control and command signals, state machine including command decoder, address counter, row and column per-decoder, and status registers. Device 150 may be any device having a use for NAND flash memory device 152. Specific examples include a mobile device, a memory stick, a camera, a solid state disk drive, and an MP3 player. Flash device 152 may form a permanent part of the device 150, or may be removable. Detailed example implementations of the memory core with multi-level row decoding are provided below. More generally, any memory core with multi-level row deciding is contemplated. The cell array is formed of sectors, each sector comprising a plurality of columns of cells. The cells also form blocks, each block comprising a plurality of rows, also referred to as pages. In some embodiments, multi-level row decoding involves performing a first level of row decoding for all of the sectors, and for each sector, performing a second level of row decoding only for that sector. In some embodiments, erasing within the memory core is performed to a resolution of one block within one sector, and read and program operations take place to a resolution of one row within one sector.

Figure 3:
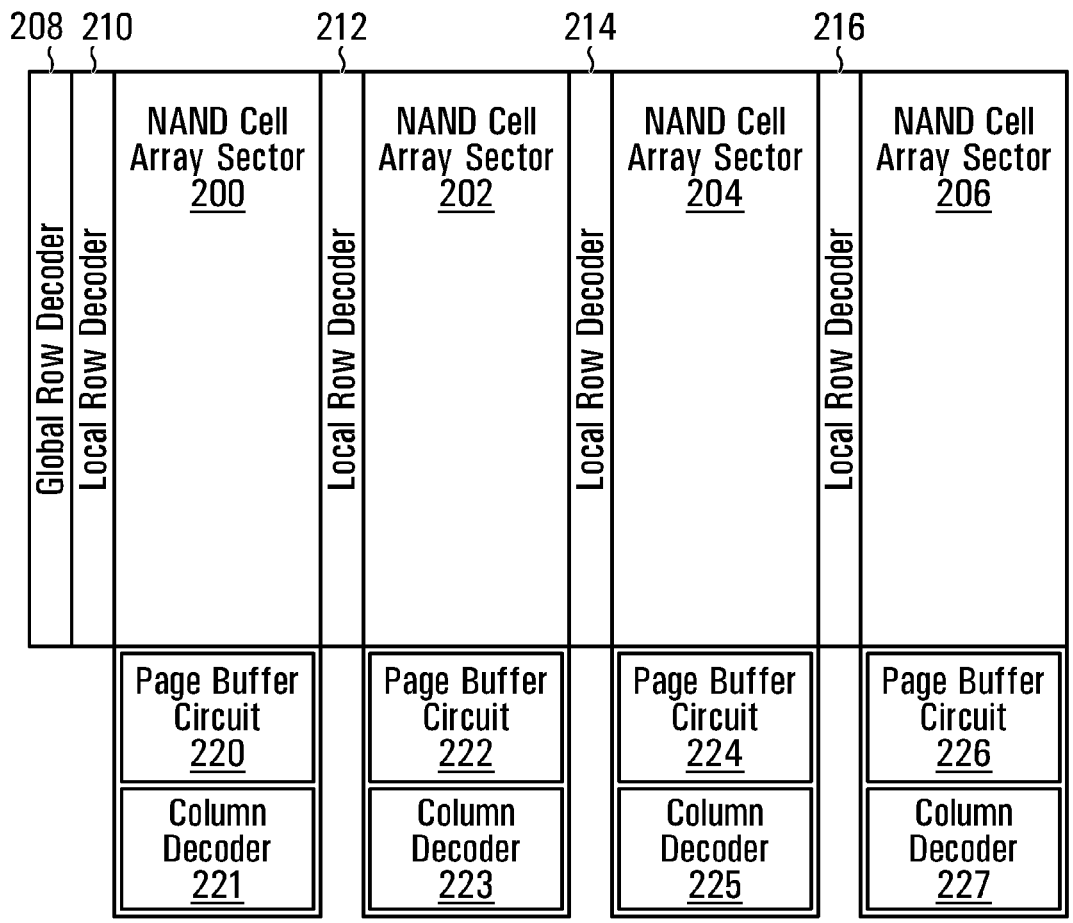
FIG. 3 is a block diagram of memory core architecture for NAND flash memory provided by an example embodiment.

Referring now to FIG. 3, shown is a core architecture provided by an example embodiment. The core architecture includes a NAND memory cell array that is implemented as at least two NAND memory cell array sectors, hereinafter simply "sectors", there being four sectors 200,202,204,206 shown in the illustrated example. The NAND memory cell array is formed of a plurality of blocks which in turn are formed of pages, also referred to as rows. The cells of each sector of the NAND memory cell array are also arranged in columns (not shown). Row decoding functionality is provided by a global row decoder 208 that performs row decoding to the level of blocks, in combination with a set of local row decoders 210,212,214,216 that perform decoding to the level of a page within a block selected by the global row decoder. More generally, the global row decoder 208 performs a first level of row decoding to select a subset of the plurality of rows. In example embodiments described herein in detail, the selectable subsets are contiguous blocks, but this need not be the case in all implementations. The local row decoders 210, 212, 214, 216 perform a second level of row decoding to select a row within the subset of the plurality of rows selected by the global row decoder 208. The local row decoders 210,212,214,216 include one local row decoder associated with each respective sector 200,202,204,206 and perform page selection local to the associated sector. Page buffer functionality is implemented with four page buffer circuits 220,222,224,226, one per sector 200,202,204,206. Column decoder functionality is implemented with four column decoders 221,223,225,227, one per sector 200,202,204, 206.

Read operation is performed to the resolution of a page within a block within a sector. Program operation is also performed to the resolution of a page within a block within a sector. However, a page within a block within a sector is erased before it is programmed. Erase operation is performed to the resolution of a block within a sector.

For a read operation, the global row decoder 208 is used to select a block of the plurality of blocks of the NAND memory cell array. Sector selection is performed by performing column selection with the page buffer circuit and column decoder associated with the desired memory sector. This can be achieved, for example, by a memory controller enabling the associated page buffer circuit and column decoder and/or sending column decoder signals to the associated page buffer circuit and column decoder. Page selection is performed by the local row decoder associated with the selected sector. In this manner, a selected page within a selected block within a selected sector can be read. During a read operation, the data of the selected page within the selected block and within the selected sector is sensed and latched into sense amplifier (not shown) and page buffer circuit of the selected sector. After that the data stored in the page buffer circuit is sequentially read out through the associated column decoder and, for example, stored in a global buffer (not shown).

For an erase operation, the global row decoder 208 is used to select a block of the plurality of blocks of the NAND memory cell array. Sector selection is performed by performing column selection with the page buffer circuit and column decoder associated with the desired memory sector. Then an appropriate erase signal is applied. In this manner, a selected block within a selected sector can be erased.

For a program operation, the global row decoder 208 is used to select a block of the plurality of blocks of the NAND memory cell array. Sector selection is performed by performing column selection with the page buffer circuit and column decoder associated with the desired memory sector. Page selection is performed by the local row decoder associated with the selected sector. Then, the contents of the page buffer circuit associated with the selected sector are programmed to the selected page within the selected block within the selected sector. During a program operation, the input data (for example from a global buffer circuit, not shown) is sequentially loaded into the page buffer circuit of the selected sector via the associated column decoder. The input data latched in the page buffer circuit is then programmed into the selected page of the selected sector.

Figure 4:
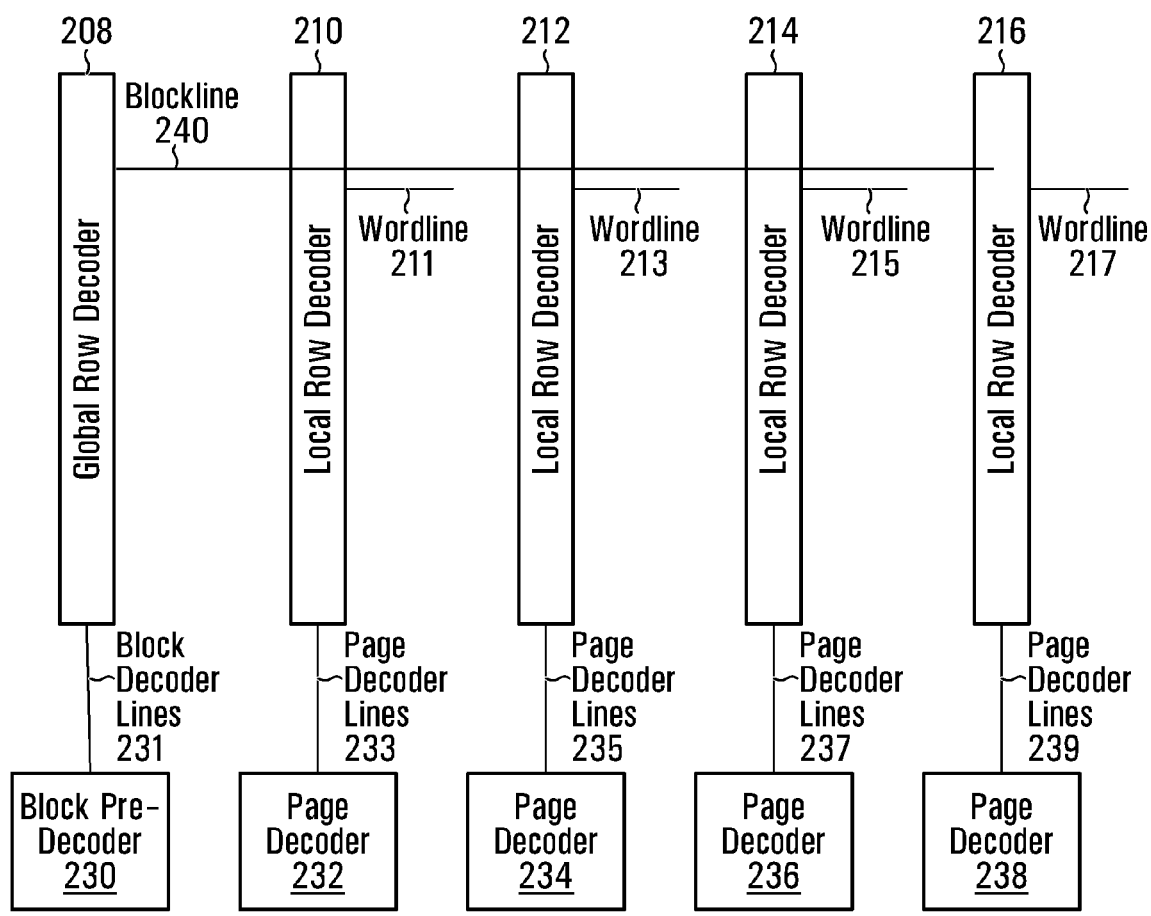
FIG. 4 is a block diagram of a memory core architecture in a NAND flash memory provided by an example embodiment.

FIG. 4 shows another example of a core architecture provided by an example embodiment. This example embodiment is similar to FIG. 2 and like components have been labelled using like reference numbers. The example embodiment of FIG. 4 has a block pre-decoder 230 connected through block decoder lines 231 to the global row decoder 208. The global row decoder 208 is connected to the memory array through a plurality of blocklines, one per block although only one blockline 240 is shown in the illustrated example. The blocklines are commonly connected to all local row decoders 210, 212,214,216. Each local row decoder 210,212,214,216 is also driven by a respective set of page decoder lines 233,235,237, 239 from a respective page decoder 232,234,236,238. Each local row decoder 210,212,214,216 is connected to the corresponding sector though a plurality of wordlines, only one shown per sector indicated at 211,213,215,219.

In operation, to select a particular block, the block predecoder 230 converts an input, for example from a memory controller, into an appropriate signal on block decoder lines 231. The global row decoder 208 selects one of block lines. To select a particular page within a particular sector, the page decoder of the associated sector (one of page decoders 232, 234,236,238) is enabled and used to select the particular page within the selected block.

Figure 5:
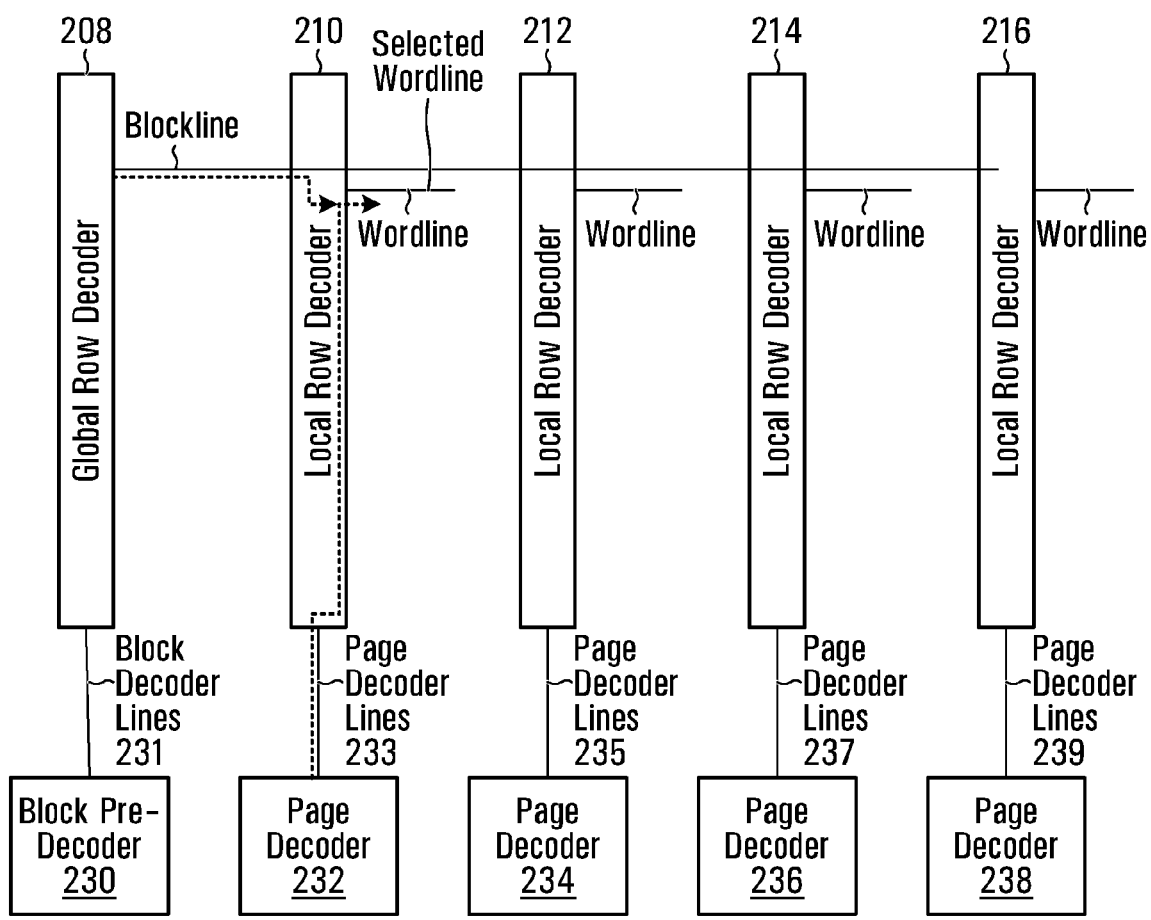
FIGS. 5 and 6 show single page read and multiple page read operation for the example embodiment of FIG. 3, respectively.
Figure 6:
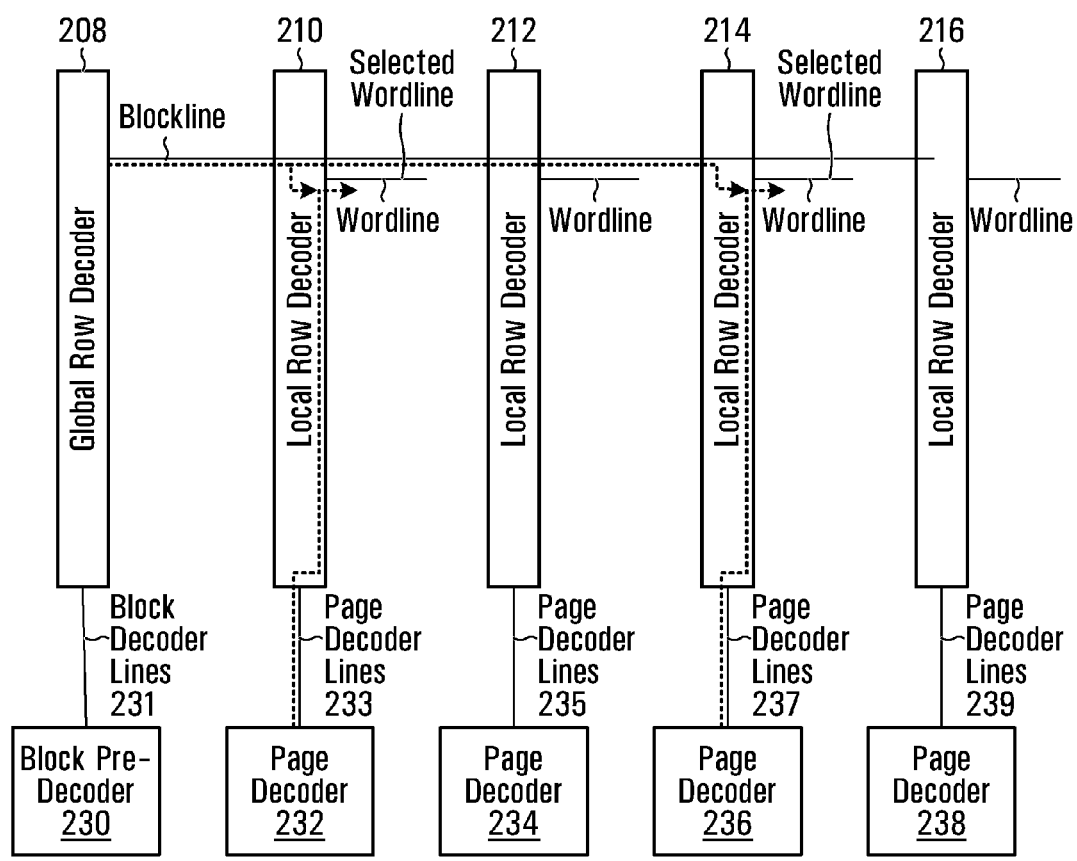

An example of single sector selection is depicted in FIG. 5 which shows selection of a page within a block for local row detector 210. In some example embodiments, the circuit is configured to allow multiple page decoders to be enabled simultaneously. In such example embodiments, within the selected block, selection of a respective page within multiple sectors can be performed by enabling multiple page decoders. An example of multiple sector selection is shown in FIG. 6 which shows selection of a row within a block by each of row decoders 210 and 214. The blockline selects one of blocks within all of the sectors while page decoder lines select one of pages (i.e. wordlines) within the selected block in each sector.

In this example embodiment, a read operation will result in one or multiple page buffer circuits containing read-out data. The contents of these page buffer circuits are then individually read out. A program operation will result in the contents of one or multiple page buffer circuits being programmed simultaneously. Typically, this will have been preceded by a series of write to page buffer operations by which the multiple page buffer circuits are written to sequentially.

Figure 7:
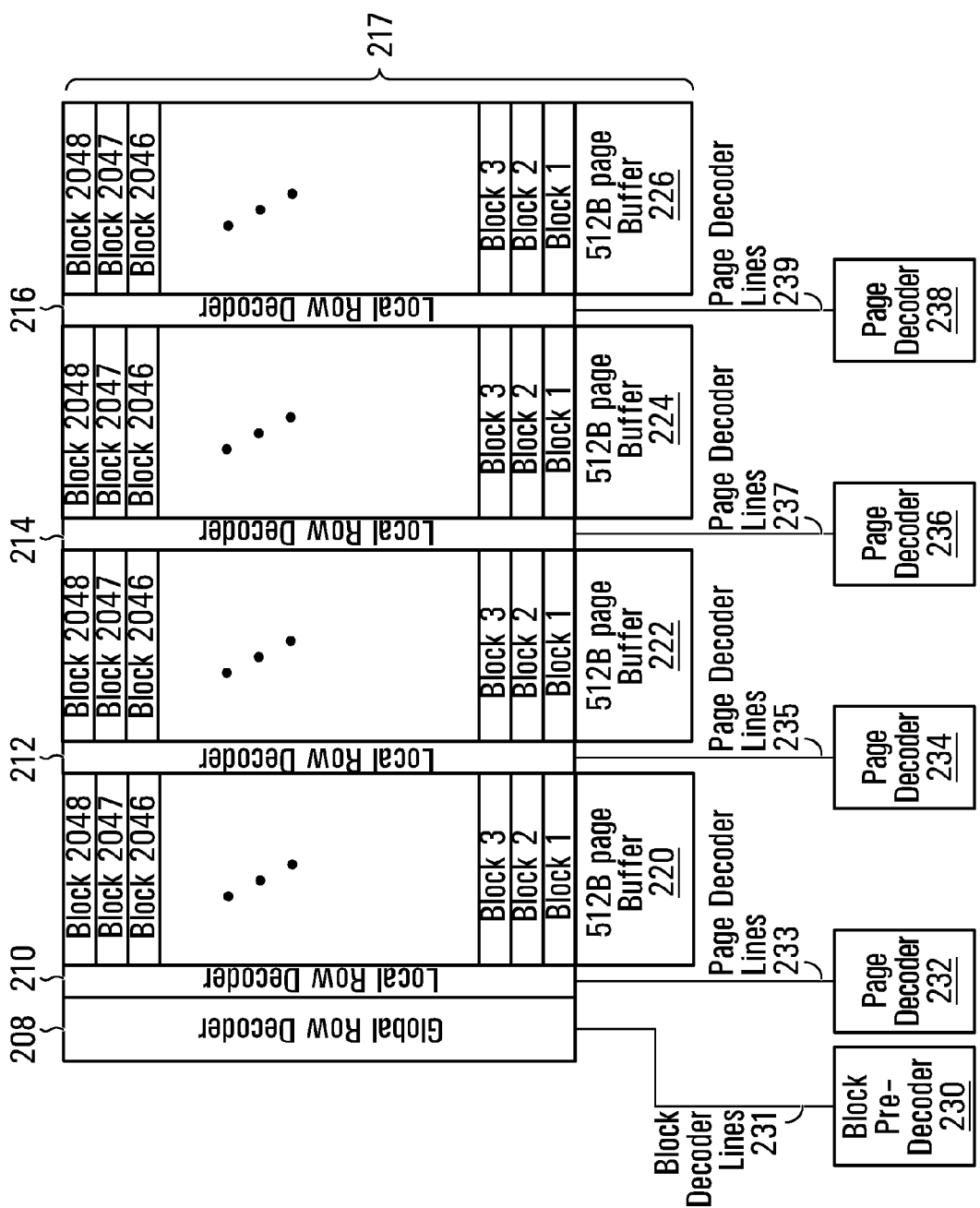
FIG. 7 is a block diagram of a memory core architecture in NAND flash memory in accordance with an example embodiment.

FIG. 7 shows more detailed core architecture provided by an example embodiment wherein again this example embodiment is similar to FIG. 3 and like components have been labelled using like reference numbers. In FIG. 7, as in other block diagrams, certain components (such as, for example, column decoders) are not shown so as not to obscure features of example embodiments. In the example, a NAND core (this can be an entire device core architecture, a plane or a bank) comprises four sectors and the page size of each sector is 512 bytes. More generally, the page size of each sector is at least one byte. In this example, there are 2048 blocks collectively indicated at 217. Each block is split into four sectors. The global row decoder 208 is connected to all of the local row decoders 210, 212, 214, 216 in common by 2048 blocklines (not shown), one per block. Each block has 32 pages.

Figure 8:
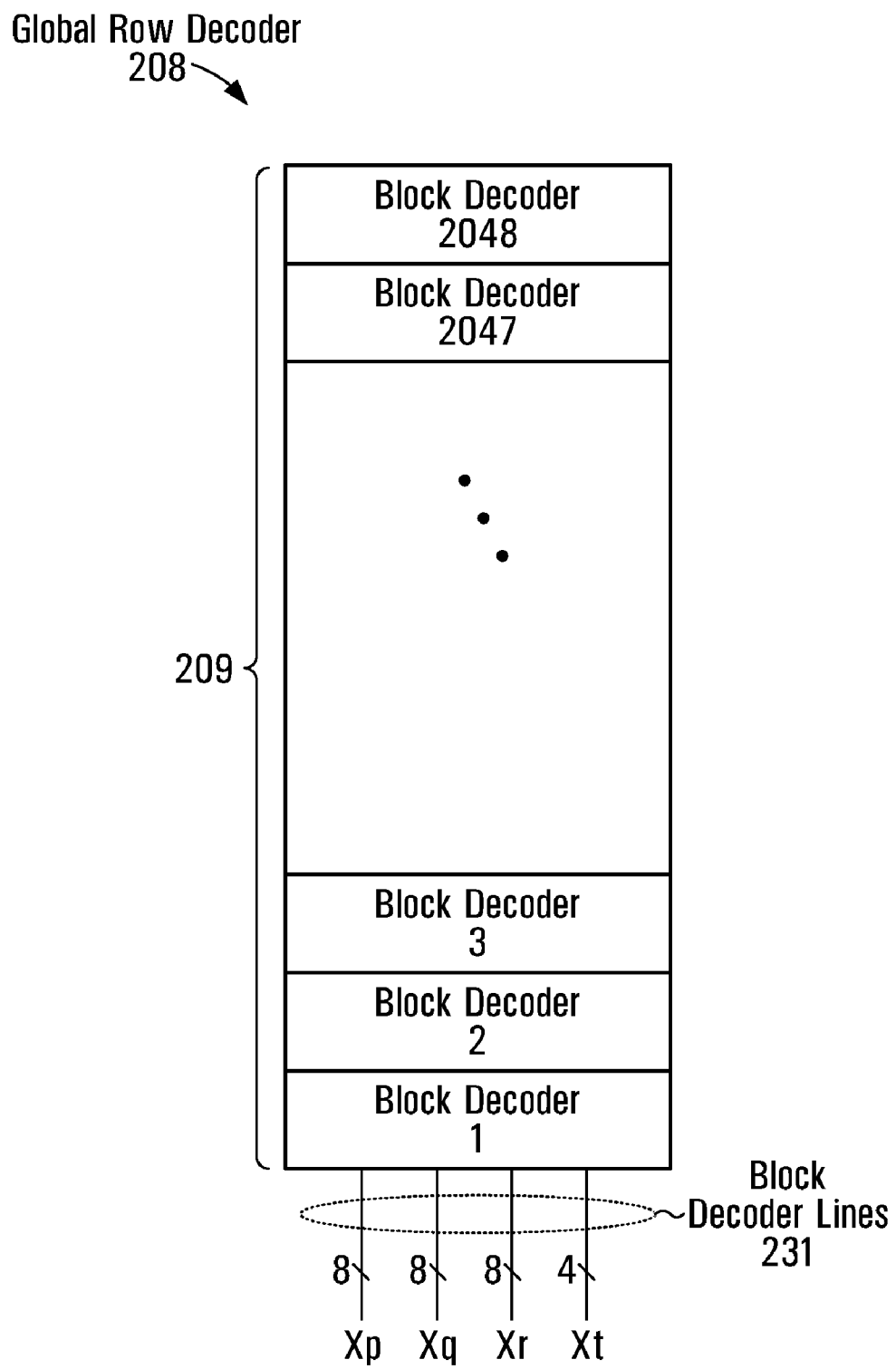
FIG. 8 is a block diagram of a global row decoder in accordance with an example embodiment.

An example implementation of the global row decoder 208 of FIG. 7 is depicted in FIG. 8. The global row decoder 208 has a respective block decoder for each block, namely 2048 block decoders collectively indicated at 209 corresponding to the number of blocks. Each of the block decoders is connected to the block decoder lines 231. In this example, the block decoder lines 231 comprises lines xp, xq, xr, xt for carrying block decoder address signals Xp, Xq, Xr and Xt. Xp, Xq, Xr and Xt are the pre-decoded lines. Xp corresponds to Address $A_6 \sim A_2$. Xq corresponds to Address $A_3 \sim A_5$. Xr corresponds to Address $A_6 \sim A_8$. Xt corresponds to Address $A_9 \sim A_{10}$ Each block decoder drives a respective blockline (not shown). The block decoder associated with the block indicated by the address signals on block decoder lines 231 drives the respective blockline to be in a select state, and all other blocklines are in a de-select state.

Figure 9:
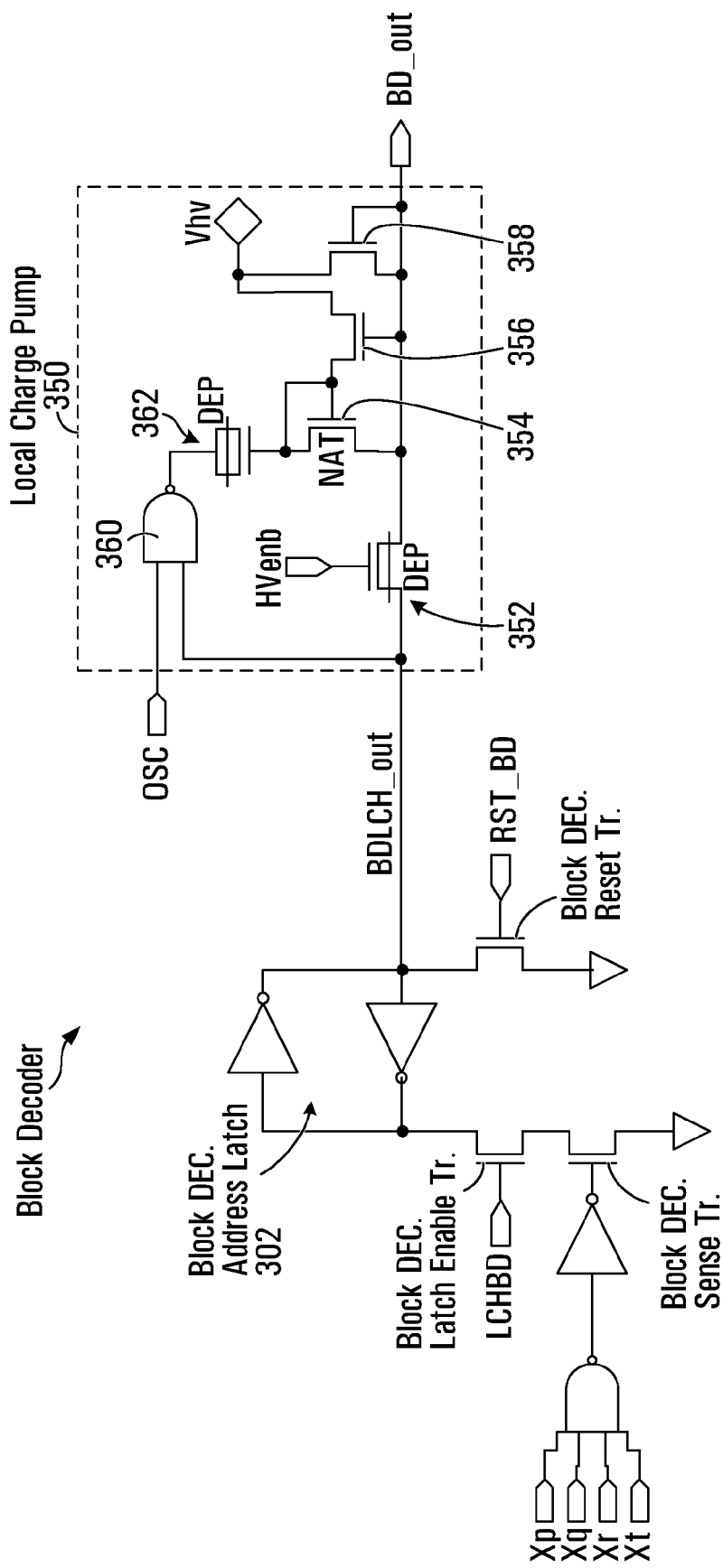
FIG. 9 is a circuit diagram of an example implementation of a single block decoder of FIG. 8.

An example circuit implementation of a single block decoder is depicted in FIG. 9. It is noted that there are many variations on circuit implementation for the block decoder, and that such variations should be readily apparent to one skilled in the art.

Figure 12:
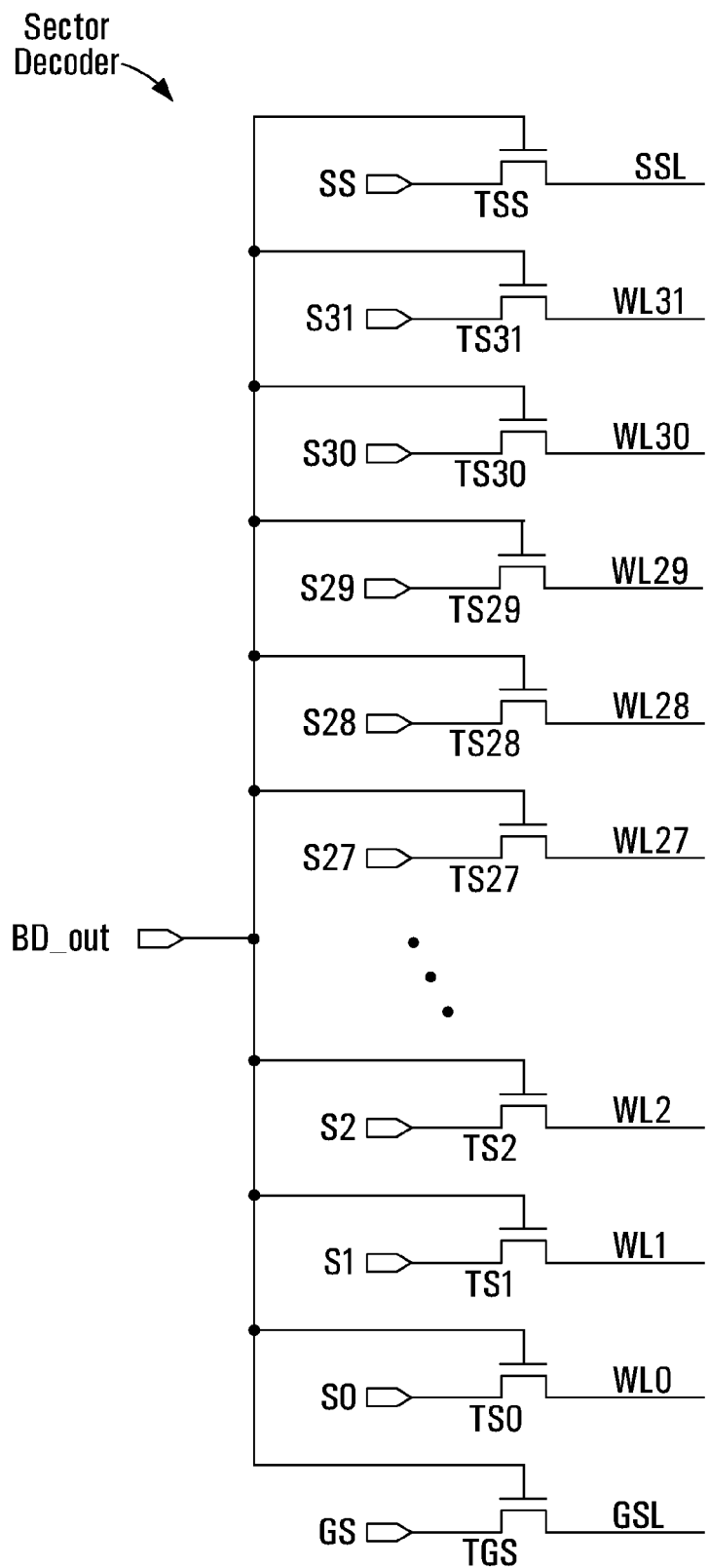
FIG. 12 is a circuit diagram of an example implementation of a single sector decoder of FIG. 10.
Figure 13:
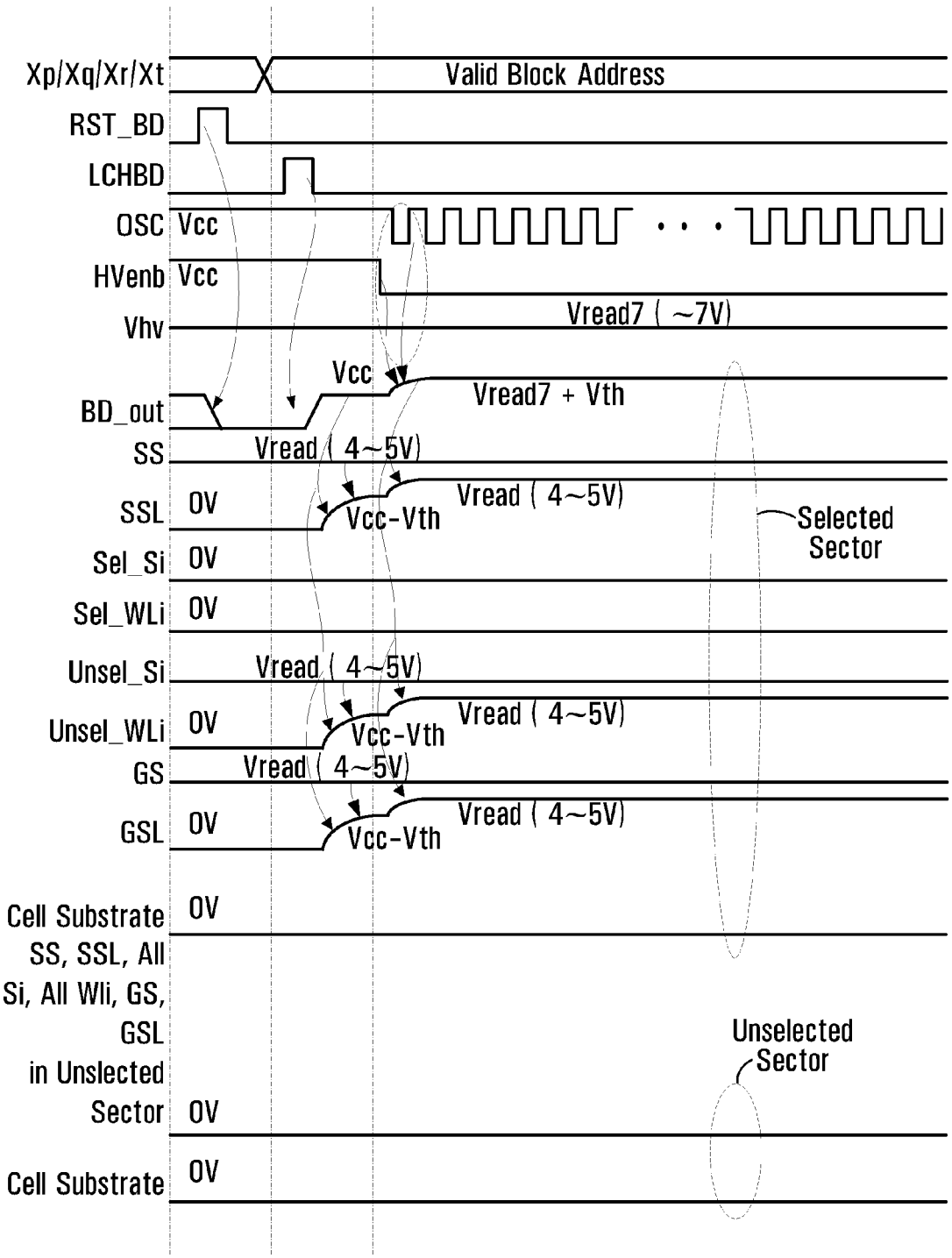
FIG. 13 is a timing diagram for read in accordance with an example embodiment.
Figure 14:
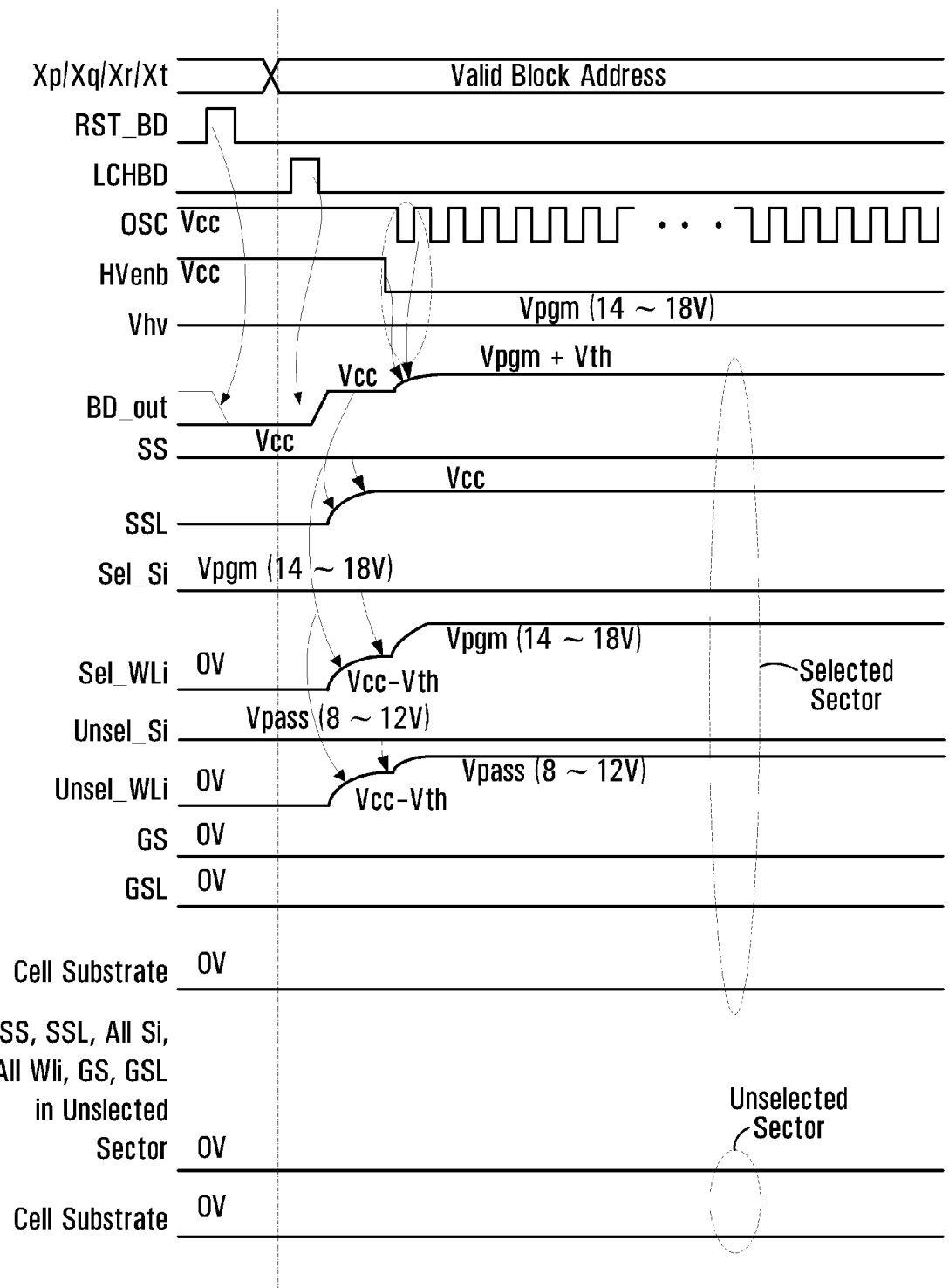
FIG. 14 is a timing diagram for program in accordance with an example embodiment.

The circuit has a block decoder address latch 302 having a latch output BDLCH_out that is reset to 0V when the RST_BD is high (actually short pulse) and latched when the LCHBD is high (which may be a short pulse) with valid predecoded address signals of Xp, Xq, Xr and Xt (block decoder lines) received at NAND logic gate 303. Detailed timing information is shown in FIGS. 12, 13 and 14 described subsequently.

The block decoder has a local charge pump 300 that is a high voltage switching circuit to provide voltages during read, program and erase operations. Local charge pump 300 includes a depletion mode n-channel pass transistor 352, a native n-channel diode-connected boost transistor 354, a high breakdown voltage n-channel decoupling transistor 356, a high breakdown voltage n-channel clamp transistor 358, a NAND logic gate 360, and a capacitor 362. NAND logic gate 360 has one input terminal for receiving the latch output BDLCH_out and another input terminal for receiving control signal OSC, for driving one terminal of capacitor 362. Pass transistor 352 is controlled by the complement of signal HVen, referred to as HVenb. The common terminals of decoupling transistor 356 and clamp transistor 358 are coupled to high voltage Vhv.

The final output signal BD_out of the each block decoder is commonly connected to all of the local row decoders, for example as depicted in FIG. 9.

The operation of local charge pump 350 will now be described. During a read operation, HVenb is at the high logic level and OSC is maintained at the low logic level. Therefore, circuit elements 362, 354, 356 and 358 are inactive, and the output terminal BD_out reflects the logic level appearing on BDLCH_out. During a program operation, HVenb is at the low logic level, and OSC is allowed to oscillate between the high and low logic levels at a predetermined frequency. If the latch output BDLCH_out is at the high logic level, then capacitor 362 will repeatedly accumulate charge on its other terminal and discharge the accumulated charge through boost transistor 354. Decoupling transistor 356 isolates Vhv from the boosted voltage on the gate of boost transistor 354. Clamp transistor 358 maintains the voltage level of output terminal BD_out at about Vhn+Vth, where Vth is the threshold voltage of clamp transistor 358. The local charge pump 300 shown in FIG. 9 is one example circuit which can be used to drive signals to a voltage levels higher than the a supply voltage VCC, but persons skilled in the art will understand other charge pump circuits can be used with similar or equal effectiveness. Table 1 below shows example bias conditions for the local charge pump 300 during read and program operations.

TABLE 1

| | Read | | Program | |
| --- | --- | --- | --- | --- |
| | Selected | Unselected | Selected | Unselected |
| BDLCH_out | Vcc | Vss | Vcc | Vss |
| Hvenb | Vss | Vss | Vss | Vss |
| OSC | Oscillation | Oscillation | Oscillation | Oscillation |
| Vhn | Vread7 (~7 V) | Vread7 (~7 V) | ~Vpgm (14 V~18 V) | ~Vpgm (14 V~18 V) |
| BD_out | Vread7 (~7 V) + Vth | Vss | Vpgm (14 V~18 V) + Vth | Vss |

The output signal BD_out of the block decoder is raised to Vhv when the block decoder latch output BDLCH_out is Vcc, HVenb is 0V and the OSC is oscillating.

Figure 10:
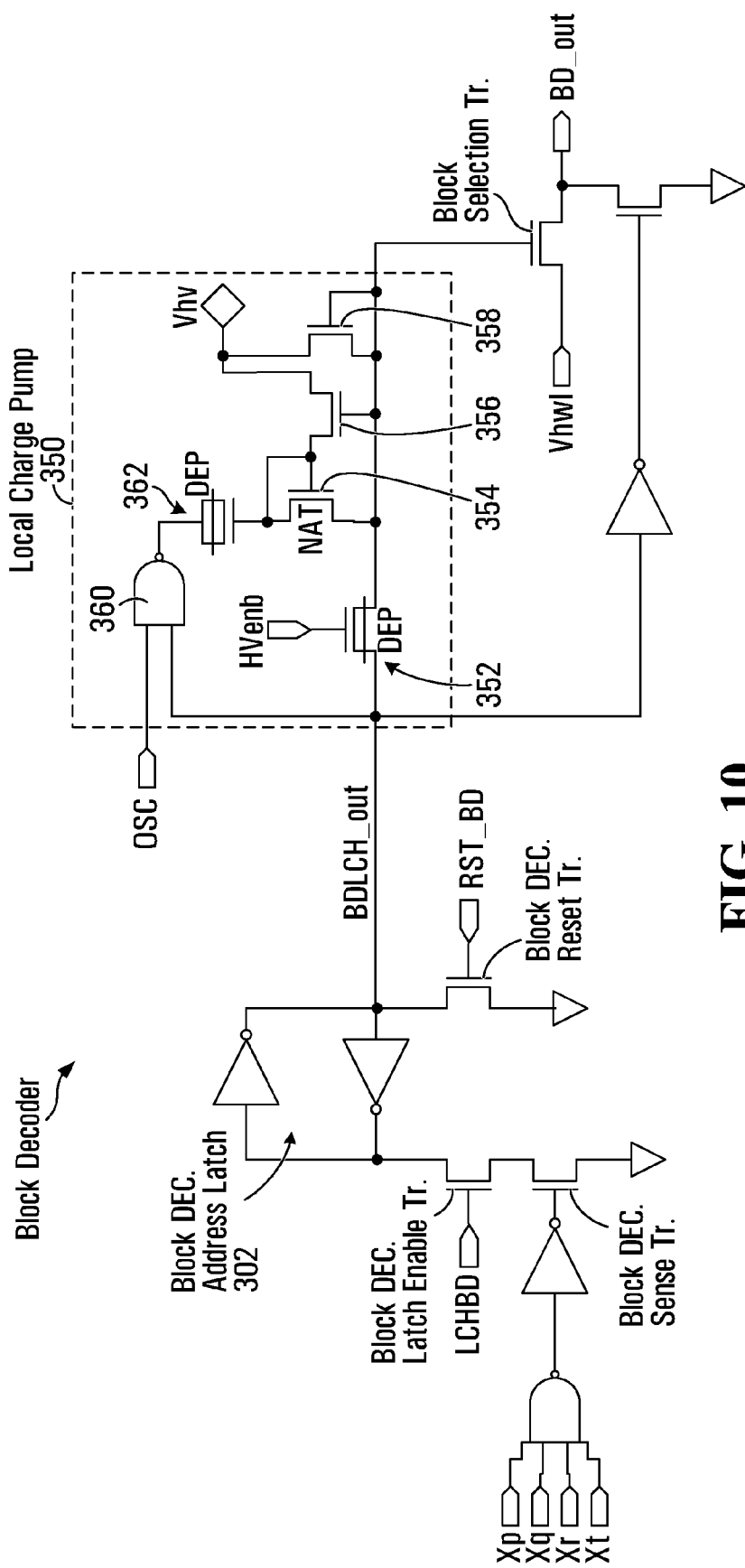
FIG. 10 is a block diagram of another example implementation of a single block decoder of FIG. 8.

Referring to FIG. 10, another example of a block decoder uses a block selection transistor. Vhwl is a high voltage source which has various levels based on operations. In this example embodiment, the drivability of BD_out is determined by the size of the block selection transistor, not the local charge pump. Therefore this circuit provides stronger drivability in the case of higher number of local row decoders in the NAND memory core.

Figure 11:
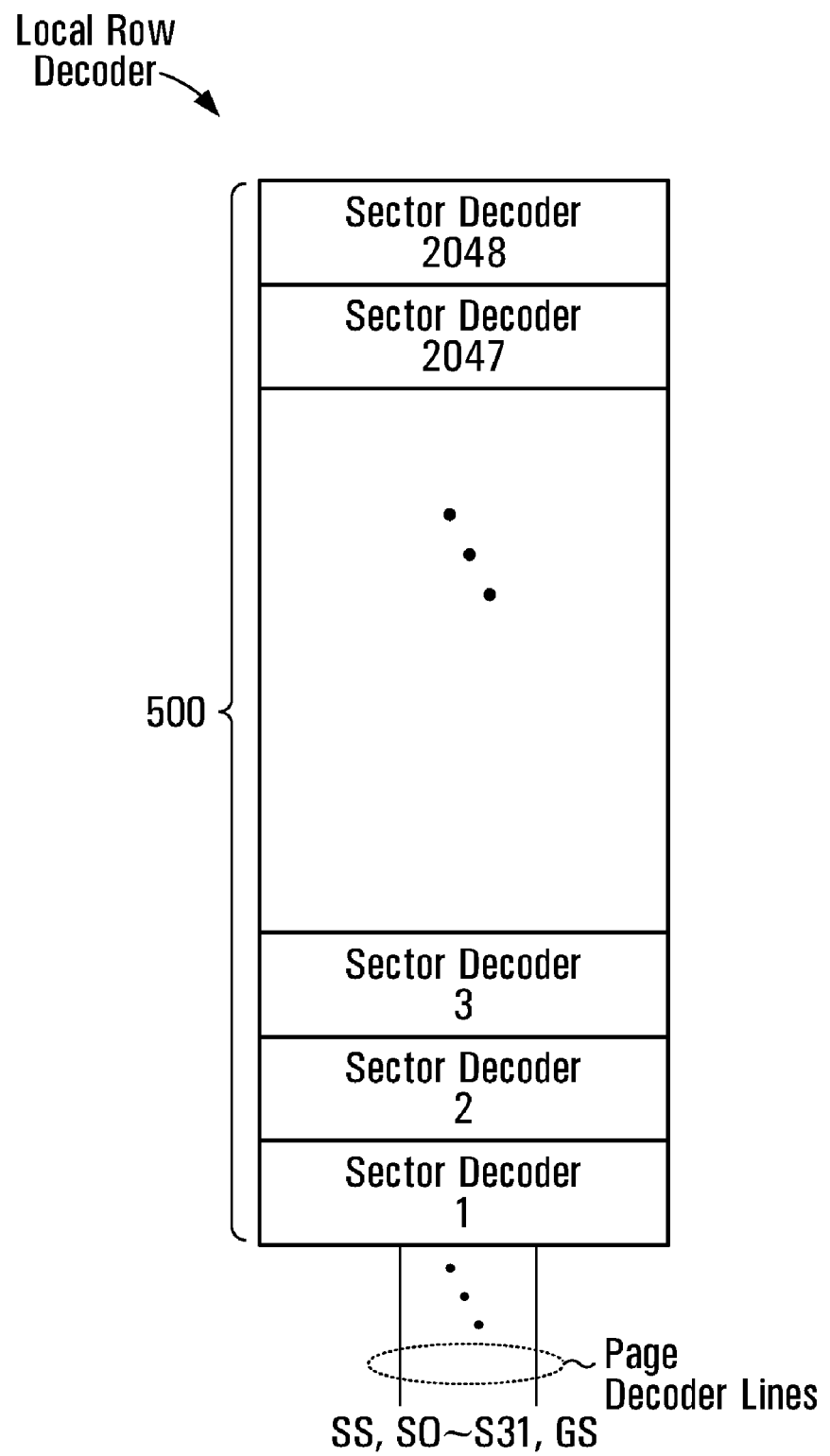
FIG. 11 is a block diagram of a local row decoder in accordance with an example embodiment.

FIG. 11 depicts an example of a local row decoder. The local row decoder has 2048 sector decoders collectively indicated at 500, one per block. These are referred to as sector decoders because a page within a sector is selected, as opposed to a page within the overall memory array. The inputs to the local row decoder are page decoder lines which in the illustrated example include string select (SS), wordline select signals S0-S31 (one per wordline), and ground select (GS). The wordline select signals S0-S31 commonly connect to the sector decoders.

and by page decoder lines that are active, the sector decoder causes a respective selected wordline (one of WL0 through WL31) to be in a selected state while the remaining wordlines are in a de-selected state.

Table 2 shows an example set of bias conditions to the block decoder, local row decoder and NAND cell array during read, program and erase. It is to be understood that all values may vary based on cell characteristics and process technology.

TABLE 2

|  | Read | Program | Erase |
|---|---|---|---|
| Selected Global Row Decoder: BD_out | Vread7 (~7 V) + Vth | Vpgm + Vth | Vcc |
| Unselected Global Row Decoder: BD_out | Vss (0 V) | Vss (0 V) | Vss (0 V) |
| Local Decoder in Selected Sector | | | |
| SS | Vread (4~5 V) | 2 V~Vcc | Floating and Vcc-Vth (Self-booting) |
| Selected Si | Vss (0 V) | Vpgm (14 V~18 V) | Vss (0 V) |
| Unselected Si | Vread (4~5 V) | Vpass (8 V~12 V) | — |
| SSL | Vread (4~5 V) | 2 V~Vcc | Floating & Self-boosting (70~90% of Vers) |
| Selected WLi | Vss (0 V) | Vpgm (14 V~18 V) | Vss (0 V) |
| Unselected WLi | Vread (4~5 V) | Vpass (8 V~12 V) | — |
| GS | Vread (4~5 V) | Vss (0 V) | Floating and Vcc-Vth (Self-booting) |
| GSL | Vread (4~5 V) | Vss (0 V) | Floating & Self-boosting (70~90% of Vers) |
| Bitlines | Pre-charged & Sensed | Vss (0 V) for program & Vcc for Program Inhibit | Clamp to Vers-0.6 V |
| Cell Substrate | Vss (0 V) | Vss (0 V) | Vers (~20 V) |
| Local Decoder in Unselected Sector | | | |
| SS | Vss (0 V) | Vss (0 V) | Vss (0 V) |
| All Si | Vss (0 V) | Vss (0 V) | Vss (0 V) |
| GS | Vss (0 V) | Vss (0 V) | Vss (0 V) |
| SSL | Vss (0 V) | Vss (0 V) | Vss (0 V) |
| All WLi | Vss (0 V) | Vss (0 V) | Vss (0 V) |
| GSL | Vss (0 V) | Vss (0 V) | Vss (0 V) |
| Bitlines | Vss (0 V) | Vss (0 V) | Vss (0 V) |
| Cell Substrate | Vss (0 V) | Vss (0 V) | Vss (0 V) |

Referring now to FIG. 12, an example circuit for a single sector decoder will be described. String select line SSL, wordlines WL0 to WL31 and ground select line GSL are driven by common signals of SS, S0 to S31 and GS through pass transistors TSS, TS0 to TS31 and TGS which are commonly controlled by the output signal BD_out of the associated block decoder. The page decoder lines, namely string select signal SS, ground select signal GS and common string decode signals S0 to S31, are provided by the page decoder.

In operation, for the block that is selected, the BD_out input of all the corresponding sector decoders is activated. This will include one sector decoder for that block in each sector. For all the remaining blocks that were not selected, the BD_out of all the corresponding sector decoders is deactivated. For a sector for which an operation is to be performed, within that sector, all of the sector decoders are commonly controlled by common page decoder lines. There may be one or more sectors for which an operation is to be performed. For a sector for which no operation is to be performed, all of the common page decoder lines are inactive such that all of the commonly connected sector decoders are inactive. For a sector decoder that is selected both by a BD_out in a select state, With this example embodiment, either single sector operation or multiple sector operation can be performed. For read operations, a single sector page read and up to a four sector page read in parallel can be performed. More generally, the maximum number of sectors that can be read in parallel is determined by the number of sectors in the NAND memory core. For program operations, a single sector page program and up to a four sector page program in parallel can be performed. More generally, the maximum number of sectors that can be programmed in parallel is determined by the number of sectors in the NAND memory core. For erase, a single sector block erase and up to a four sector block erase in parallel can be performed. More generally, the maximum number of sectors that can be erased in parallel is determined by the number of sectors in the NAND memory core.

FIG. 13 shows an example of read operation timing in accordance with some example embodiments. The voltage bias conditions during read for this example are defined in Table 2 above for this example. All signals in each unselected sectors remain at 0V. This operation timing is based on the use of the block decoder shown in FIG. 9.

FIG. 14 shows an example of program operation timing in accordance with some example embodiments. The voltage bias conditions during program for this example are defined in Table 2 above for this example. All signals each unselected sectors remain at 0V. This operation timing is based on the use of the block decoder shown in FIG. 9.

Figure 15:
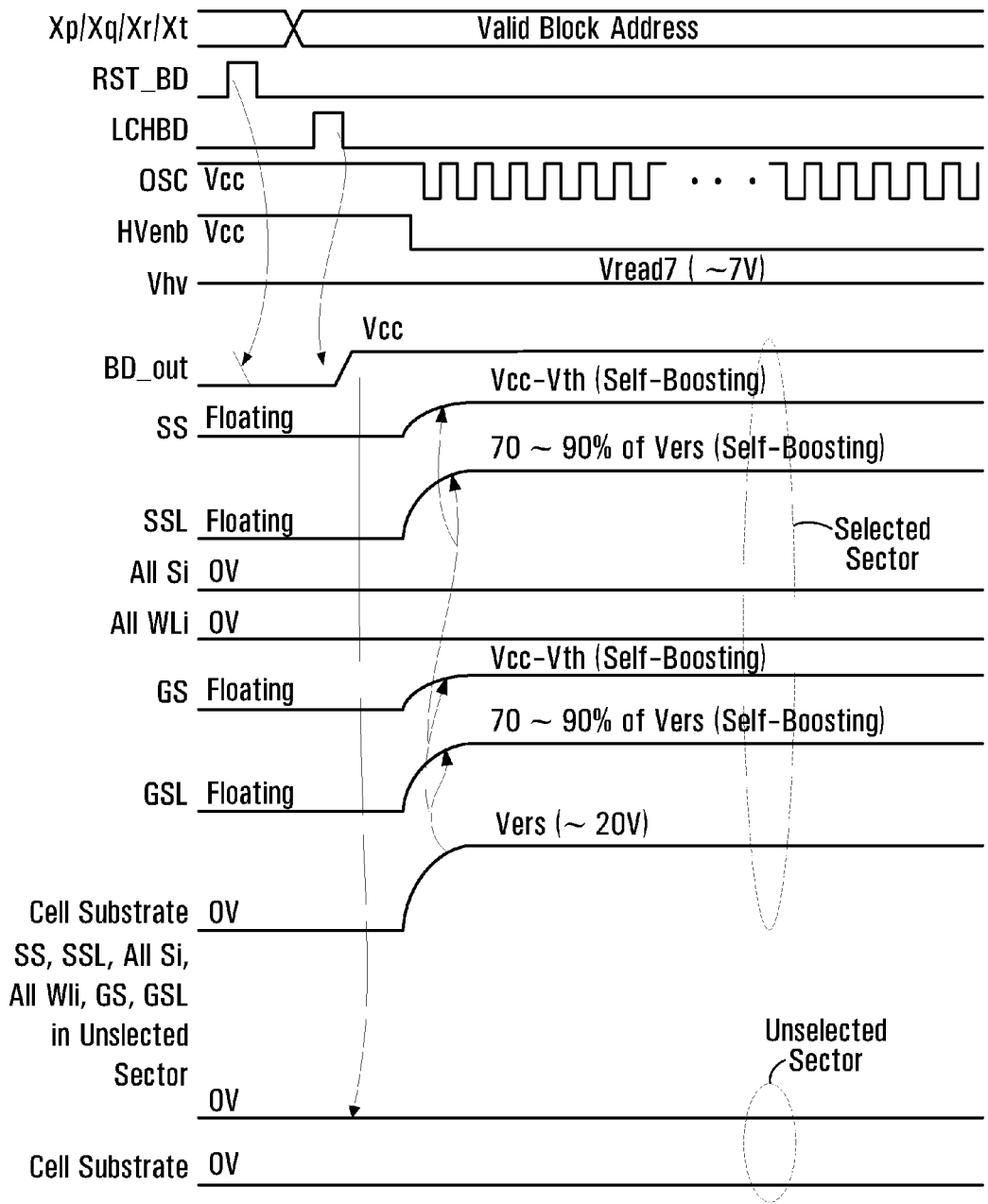
FIG. 15 is a timing diagram for erase in accordance with an example embodiment.

FIG. 15 shows an example of erase operation timing in accordance with some example embodiments. The voltage bias conditions during erase are defined in Table 2 above for this example. All signals in unselected sectors remain at 0V. This operation timing is based on the use of the block decoder shown in FIG. 9.

In FIGS. 13, 14, 15, Sel_Si is short form for any "selected" Si input signal (where Si={$S_0 \ldots S_{31}$}). Unsel_Si is short form for any "unselected" Si input signal (where Si={$S_0 \ldots S_{31}$}). Sel_WLi is short form for any "selected" word line signal (where WLi={$WL_0 \ldots WL_{31}$}). Unsel_WLi is short form for any "unselected" word line signal (where WLi={$WL_0 \ldots WL_{31}$}).

It will be understood that when an element is herein referred to as being "connected" or "coupled" to another element, it can be directly connected or coupled to the other element or intervening elements may be present. In contrast, when an element is herein referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Certain adaptations and modifications of the described embodiments can be made. Therefore, the above discussed embodiments are considered to be illustrative and not restrictive.

I claim:

1. A NAND flash memory core with multi-level row decoding comprising:
    a NAND memory cell array comprising a plurality of sectors each sector having a plurality of columns and a plurality of rows;
    a global row decoder that performs a first level of row decoding for all of the sectors;
    for each sector, a corresponding local row decoder that performs a second level of row decoding only for that sector;
    wherein the plurality of sectors consists of n sectors, and the NAND flash memory core is configured to:
    execute first read and program operations for a selected single sector; and
    execute second read and program operations in parallel for a selected plurality of sectors up to all n of the sectors.

2. The NAND flash memory core of claim 1 wherein:
    the NAND memory cell array comprises a plurality of blocks, each block comprising a plurality of rows, each row comprising memory cells of each of the sectors;
    the global row decoder performs row decoding to select one block from the plurality of blocks.

3. The NAND flash memory core of claim 2 configured to perform read and program operations to a resolution of one row within one sector, and to perform erase operations to a resolution of one block within one sector.

4. The NAND flash memory core of claim 1 wherein:
    the plurality of sectors of the NAND memory cell array and local row decoders are arranged in a layout that alternates between local row decoder and corresponding sector of the NAND memory cell array.

5. The NAND flash memory core of claim 1 further comprising:
    for each sector, a corresponding page buffer circuit.

6. The NAND flash memory core of claim 1 further comprising:
    for each sector, a corresponding page decoder.

7. The NAND flash memory core of claim 1 further comprising:
    for each sector, a corresponding column decoder.

8. The NAND flash memory core of claim 1 further comprising:
    connections between the global row decoder and the local row decoders that comprise a plurality of blocklines that are each commonly connected to each local row decoder.

9. The NAND flash memory core of claim 8 wherein the global row decoder comprises:
    a plurality of block decoders each commonly connected to block decoder lines, each block decoder connected to one of the plurality of blocklines.

10. The NAND flash memory core of claim 9 further comprising:
    a block pre-decoder that receives an address or portion of an address, and generates a block decoder output on the block decoder lines;
    the global row decoder comprising a plurality of block decoders commonly connected to the block decoder lines.

11. The NAND flash memory core of claim 1 further comprising:
    for each local row decoder, connections between the local row decoder and the NAND memory cell array that comprise a plurality of wordlines, each wordline connecting the local row decoder to memory cells of an associated row in the corresponding sector.

12. The NAND flash memory core of claim 1 further comprising:
    for each sector, a corresponding page decoder connected to the local row decoder of that sector through page decoder lines.

13. The NAND flash memory core of claim 12 wherein each local row decoder comprises a plurality of sector decoders, wherein the sector decoders of a given local row decoder are commonly connected to the page decoder lines of the page decoder for that sector.

14. The NAND flash memory core of claim 1 wherein:
    the NAND flash memory core is configured to execute the first read and program operations for the selected single sector by:
    the global row decoder performing the first level of row decoding to select a subset of the plurality of rows;
    the corresponding local row decoder of the selected single sector performing the second level of row decoding to select a row within the subset of the plurality of rows selected by the global row decoder; and
    the NAND flash memory core is configured to execute the second read and program operations in parallel for the selected plurality of sectors up to all n of the sectors by:
    the global row decoder performing the first level of row decoding to select a subset of the plurality of rows, and
    for each sector of the selected plurality of sectors, the corresponding local row decoder of the sector performing the second level of row decoding to select a row within the subset of the plurality of rows selected by the global row decoder.

15. A NAND flash memory core with multi-level row decoding comprising:
    a NAND memory cell array comprising a plurality of sectors each sector having a plurality of columns and a plurality of rows;

a global row decoder that performs a first level of row decoding for all of the sectors;

for each sector, a corresponding local row decoder that performs a second level of row decoding only for that sector;

for each sector, a corresponding page decoder;

page decoder lines connecting each page decoder to the corresponding local row decoder;

wherein the NAND flash memory core is configured to execute first read and program operations for a selected single sector by:

the global row decoder performing a first level of row decoding to select a subset of the plurality of rows;

the page decoder of the selected single sector receiving an address or portion of an address, and generating a page decoder output on the page decoder lines;

the corresponding local row decoder of the selected single sector performing the second level of row decoding to select a row within the subset of the plurality of rows selected by the global row decoder as a function of the page decoder output;

for the first read and program operations, reading includes transferring contents of the selected row of the selected sector into the corresponding page buffer circuit, and programming includes transferring contents of the corresponding page buffer circuit to the selected row of the selected sector;

to execute second read and program operations in parallel for a selected plurality of sectors up to all n of the sectors, the global row decoder performing a first level of row decoding to select a subset of the plurality of rows, and for each sector of the selected plurality of sectors:

the page decoder of the sector receiving an address or portion of an address, and generating a page decoder output on the page decoder lines;

the corresponding local row decoder of the sector performing the second level of row decoding to select a row within the subset of the plurality of rows selected by the global row decoder as a function of the page decoder output;

for the second read and program operations, reading includes transferring contents of the selected row of the sector into the corresponding page buffer circuit, and programming includes transferring contents of the corresponding page buffer circuit to the selected row of the sector.

16. A NAND flash memory core with multi-level row decoding comprising:

a NAND memory cell array comprising a plurality of sectors each sector having a plurality of columns and a plurality of rows;

a global row decoder that performs a first level of row decoding for all of the sectors;

for each sector, a corresponding local row decoder that performs a second level of row decoding only for that sector;

the NAND memory cell array comprises a plurality of blocks, each block comprising a plurality of rows, each row comprising memory cells of each of the sectors;

the global row decoder performs row decoding to select one block from the plurality of blocks;

execute a first erase for a selected block within a selected single sector; and execute a second erase for a selected block in parallel for a selected plurality of sectors up to all n of the sectors.

17. A method comprising:

in a NAND flash memory core, performing multi-level row decoding, the method for use in the NAND flash memory core comprising a NAND memory cell array comprising a plurality of sectors, each sector having a plurality of columns and a plurality of rows, the method comprising:

performing a first level of row decoding for all of the sectors;

performing a second level of decoding for at least one sector;

the method for use in the NAND flash memory core comprising a plurality of blocks, each block comprising a plurality of rows, each row comprising memory cells of each of the sectors, wherein:

performing a first level of row decoding comprises performing row decoding to select one block from the plurality of blocks;

the method for use in the NAND flash memory core in which the plurality of sectors consists of n sectors, the method further comprising:

performing first read and program operations to a resolution of one row within one sector for a selected single sector; and performing second read and program operations to a resolution of one row within one sector in parallel for a selected plurality of sectors up to all n of the sectors.

18. A method comprising:

in a NAND flash memory core, performing multi-level row decoding, the method for use in the NAND flash memory core comprising a NAND memory cell array comprising a plurality of sectors, each sector having a plurality of columns and a plurality of rows, the method comprising:

performing a first level of row decoding for all of the sectors;

performing a second level of decoding for at least one sector;

the method for use in the NAND flash memory core comprising a plurality of blocks, each block comprising a plurality of rows, each row comprising memory cells of each of the sectors, wherein:

performing a first level of row decoding comprises performing row decoding to select one block from the plurality of blocks comprising:

performing first read and program operations for a selected single sector by:

performing the first level of row decoding to select a subset of the plurality of rows;

performing the second level of row decoding to select a row within the selected subset of the plurality of rows; and performing second read and program operations in parallel for a selected plurality of sectors up to all n of the sectors by:

the global row decoder performing the first level of row decoding to select a subset of the plurality of rows, and for each sector of the selected plurality of sectors, performing the second level of row decoding to select a row within the selected subset of the plurality of rows.

19. A device comprising:

a NAND flash memory core with multi-level row decoding, the NAND flash memory core including memory cell array sectors, and the NAND flash memory core being configured to:

execute first programming for a selected single memory cell array sector; and execute second programming in parallel for a selected plurality of memory cell array sectors up to all n of the sectors.

20. The device of claim 19 wherein the NAND flash memory core further includes a global row decoder that performs a first level of row decoding for all of the n memory cell array sectors, the NAND flash memory core further including, for each memory cell array sector, a corresponding local row decoder that performs a second level of row decoding only for that sector.

21. The device of claim 20 wherein the n memory cell array sectors and local row decoders are arranged in a layout that alternates between local row decoder and corresponding memory cell array sector of the NAND flash memory core.

22. The device of claim 19 further comprising:
for each memory cell array sector, a corresponding page buffer circuit.

23. The device of claim 19 further comprising:
for each memory cell array sector, a corresponding page decoder.

24. The device of claim 19 further comprising:
for each memory cell array sector, a corresponding column decoder.

* * * * *